(12) United States Patent
Becker et al.

(10) Patent No.: US 11,789,060 B2
(45) Date of Patent: Oct. 17, 2023

(54) GROUNDED SOCKET AND METHOD FOR INSULATION FAULT LOCATION IN AN UNGROUNDED POWER SUPPLY SYSTEM INCLUDING INSULATION MONITORING

(71) Applicant: Bender GmbH & Co. KG, Gruenberg (DE)

(72) Inventors: Pascal Becker, Gruenberg (DE); Karl Schepp, Reiskirchen (DE)

(73) Assignee: BENDER GMBH & CO. KG, Gruenberg (DE)

( * ) Notice: Subject to any disclaimer, the term of this patent is extended or adjusted under 35 U.S.C. 154(b) by 18 days.

(21) Appl. No.: 17/338,770

(22) Filed: Jun. 4, 2021

(65) Prior Publication Data
US 2021/0382104 A1    Dec. 9, 2021

(30) Foreign Application Priority Data

Jun. 4, 2020    (DE) ...................... 10 2020 114 906.9

(51) Int. Cl.
*G01R 31/08* (2020.01)
*H01R 13/652* (2006.01)
*H01R 13/66* (2006.01)
*H01R 13/717* (2006.01)

(52) U.S. Cl.
CPC ......... *G01R 31/086* (2013.01); *H01R 13/652* (2013.01); *H01R 13/6683* (2013.01); *H01R 13/7175* (2013.01)

(58) Field of Classification Search
CPC .... G01R 31/086; G01R 31/52; G01R 1/0416; G01R 27/025; G01R 27/18; G01R 31/14; G01R 31/40; G01R 31/42; H01R 13/652; H01R 13/6683; H01R 13/7175
See application file for complete search history.

(56) References Cited

U.S. PATENT DOCUMENTS

| 6,169,406 B1 * | 1/2001 | Peschel .................. G01R 31/14 |
| | | 324/555 |
| 9,753,069 B2 * | 9/2017 | Liu ....................... G01R 27/025 |

(Continued)

FOREIGN PATENT DOCUMENTS

| DE | 202004006164 U1 | 8/2004 |
| DE | 202004008334 U1 | 9/2004 |

(Continued)

*Primary Examiner* — Akm Zakaria
(74) *Attorney, Agent, or Firm* — Dickinson Wright PLLC; Andrew D. Dorisio (57) ABSTRACT

A grounded socket and a method for insulation fault location in an ungrounded power supply system including insulation monitoring by a standard insulation monitoring device superimposing a measuring voltage on the ungrounded power supply system for determining an insulation resistance of the ungrounded power supply system. The grounded socket includes a housing having electrical contacts, a signaling device for signaling an insulation state, and a current measuring device for detecting and evaluating a differential current, the current measuring device having a measuring current transformer and evaluating electronics, and the current measuring device being configured for high-resolution detection and evaluation of a measuring current driven by the measuring voltage as a differential measuring current.

16 Claims, 6 Drawing Sheets

(56) References Cited

U.S. PATENT DOCUMENTS

| | | | |
|---|---|---|---|
| 2001/0029433 A1* | 10/2001 | Scott | G01R 31/1272 |
| | | | 702/58 |
| 2005/0218906 A1* | 10/2005 | Younsi | G01R 31/346 |
| | | | 324/551 |
| 2013/0128396 A1* | 5/2013 | Danesh | G01R 23/02 |
| | | | 361/45 |
| 2019/0120892 A1 | 4/2019 | Dzienis et al. | |
| 2019/0131925 A1* | 5/2019 | Sano | H02S 40/32 |

FOREIGN PATENT DOCUMENTS

| | | | |
|---|---|---|---|
| DE | 202005018741 U | 4/2006 | |
| DE | 102011083792 A1 | 4/2013 | |
| DE | 102014201044 B3 | 3/2015 | |
| DE | 102014223287 A1 | 5/2016 | |
| WO | WO-2019086917 A1 * | 5/2019 | H01M 10/48 |

* cited by examiner

GROUNDED SOCKET AND METHOD FOR INSULATION FAULT LOCATION IN AN UNGROUNDED POWER SUPPLY SYSTEM INCLUDING INSULATION MONITORING

This application claims the benefit of German Patent Application No. 10 2020 114 906.9, filed Jun. 4, 2020 the disclosure of which is incorporated herein by reference.

TECHNICAL FIELD

The invention relates to a grounded socket for insulation fault location and to a method for insulation fault location in an ungrounded power supply system including insulation monitoring by a standard insulation monitoring device superimposing a measuring voltage on the ungrounded power supply system for determining an insulation resistance of the ungrounded power supply system.

BACKGROUND

The network type of an ungrounded power supply systems, which is also referred to as an insulated network or as an IT (French: isolé terre) network, is used to ensure high availability and operational safety of the electrical power supply.

In this type of power supply system, the active parts of the IT network are separated from the ground potential, i.e., insulated against ground, or connected to ground via a high impedance. The frames (conductive housings) of the loads connected to the IT network are connected to the ground potential (grounded) individually or jointly by means of a protective conductor.

The advantage of the IT networks is that an insulation fault (first fault), such as a ground fault or a fault to frame, will not affect the function of the connected loads since the ideally infinitely large impedance value means that no closed fault circuit can form between an active conductor of the IT network and ground. This inherent safety thus allows a continuous power supply of the loads fed by the ungrounded power supply system to be ensured even if a first insulation fault occurs. Hence, this network type is employed in particular in medically used areas.

Therefore, the resistance of the ungrounded power supply system against ground has to be constantly monitored since a possible other fault on another active conductor (second fault) would lead to a fault loop, and—in connection with an overcurrent protection device—the current flowing in this case would cause the installation to be shut down and operation to come to a halt.

The ungrounded power supply system is monitored according to standard IEC61557-8 using an insulation monitoring device (IMD) which is connected between at least one of the active conductors of the ungrounded power supply system and ground and superimposes a measuring voltage on the ungrounded power supply system, causing a measuring current to form which corresponds to the insulation fault and whose magnitude is in the µA range.

On the condition that the insulation state of the ungrounded power supply system is therefore continuously monitored by the insulation monitoring device, the ungrounded power supply system can continue to be operated indefinitely even if a first fault has occurred; however, it is advisable for the first fault to be removed as fast as practically possible.

When the insulation fault monitoring device has detected an insulation fault in a first step, the insulation fault search starts in a second step with a test device or the insulation monitoring device feeding a test current into the IT network by means of a test current generator. This test current, which is typically greater than the measuring current with a view to reliable detection and can be several milliamperes, is detected by all measuring current transformers located in a faulty line output (branch) of the ungrounded power supply system and is evaluated in evaluating electronics of an insulation fault evaluating device and displayed in a signaling device. The fault position can be located based on which circuit or line output the measuring current transformer is assigned to.

However, this solution, which corresponds to the general state of the art, does have several disadvantages.

First, the measuring current transformers are only assigned to the respective line outputs of the ungrounded power supply system and not to the individual connection points (sockets) for the loads.

Second, too long a period of time often goes by until the faulty line output is signaled, said period of time being mainly composed of the measuring time of the insulation monitoring device, the measuring time of the insulation fault searching device subsequently put into operation, and the duration until an alarm signal is registered at a signaling device, which is typically located at some distance from a socket. So if a faulty load is put into operation by plugging the feed line of the load into a socket in an operating theater, it can take up to 60 seconds or longer in practice until the medical personnel is informed via an optical display or an acoustic signal that an insulation fault is present in the respective line output or in a load connected to this branch. In this situation, a quick assignment of the insulation fault to a specific load is often not possible anymore. Usually, an electrician will have to determine the faulty load by a time-consuming manual insulation fault search.

In unexamined patent publication DE 102011083792 A1, an insulation fault searching device is described which allows direct assignment to a load. However, aside from the measuring current induced by the insulation monitoring device for determining the insulation resistance (first step), subsequent feeding of a test current for insulation fault search (second step) is still required there. After the insulation resistance measurement, a test current which can be detected at a grounded socket by a measuring current transformer is fed into the ungrounded power supply network. In this case, the detection times for a faulty load are still in the range of about 10 seconds. A method which allows signaling nearly in real time, i.e., immediately when the load connector is plugged into the socket, is currently unknown.

SUMMARY

Therefore, the object of the present invention is to design a device and a method which allow a load exhibiting an insulation fault to be detected and signaled as fast and reliably as possible directly at the connection point of the load.

According to the invention, this object is attained by a grounded socket for insulation fault location comprising a housing having electrical contacts, a signaling device for signaling an insulation state and a current measuring device for detecting and evaluating a differential current, the current measuring device having a measuring current transformer and evaluating electronics and being configured for high-resolution detection and evaluation of a measuring current driven by the measuring voltage as a differential measuring current.

The idea of the present invention is advantageously based on high-resolution detection and evaluation of the present measuring current effected by the insulation monitoring device, which is mandatory according to standards, for the purpose of insulation resistance determination—instead of a measuring current generated specifically therefor—as a differential measuring current directly in a socket for the purpose of insulation fault location.

According to standards, the mandatory insulation monitoring device—which is not part of the invention—has to meet requirements regarding its internal resistance and the height of the measuring voltage, resulting in a maximum measuring current whose magnitude is in the µA range (microampere range).

The fact that a highly sensitive current measuring device in the µA range consisting of a measuring current transformer and evaluating electronics is used according to the invention allows the measuring current of the insulation monitoring device to be constantly monitored.

The measuring current driven by the measuring voltage of the insulation monitoring device is detected by the measuring current transformer as a differential measuring current and, once evaluated and signaled, allows an immediate assessment of an insulation fault.

For example, an increase in the measuring current from 10 µA to 50 µA after a faulty load has been plugged in is detected in the preferably microprocessor-based evaluating electronics and leads to immediate signaling of a deteriorated insulation state through an optical and/or acoustic signal.

The immediate high-resolution detection and evaluation of the measuring current directly at the connection point (socket) of the load renders feeding of a separate test current after detection of an insulation fault unnecessary. A time-consuming insulation fault search using automatic or manual insulation fault searching devices is no longer required.

Moreover, electrical safety is increased since the absence of test currents in the mA range (milliampere range) reduces the risk of malfunctions of high-sensitivity sensors in the power supply system and therefore increases the acceptance of selective insulation monitoring even in a critical system environment.

Furthermore, this has the advantage that medical areas do not have to be kept completely empty for the duration of a common insulation fault search.

In another advantageous embodiment, the current measuring device is configured to detect and evaluate a fault current flowing at the network frequency of the ungrounded power supply system as a differential fault current.

In addition to high-resolution detection and evaluation of the measuring current driven by the measuring voltage as a differential measuring current, the current measuring device is capable of detecting and evaluating a fault current caused by a network voltage at network frequency in an ungrounded alternating-voltage power supply system as a differential fault current.

Since a leakage current flows across the always present leakage capacitances in the ungrounded power supply system in the event of an asymmetrical insulation fault, said fault current can be detected as a differential fault current by the measuring current transformer. A change in this differential fault current due to the connection of a faulty load can be detected very quickly (in less than a second) by the current measuring device and can be displayed by the signaling device through an optical and/or acoustic signal.

Advantageously, the current measuring device is AC/DC-sensitive.

This configuration allows (smooth) direct fault currents, pulsated direct fault currents and alternating fault currents to be detected and evaluated in particular in ungrounded direct-voltage power supply systems and inverter-operated ungrounded power supply systems.

Furthermore, the current measuring device has a test loop routed through the measuring current transformer for generating a test current.

A test current corresponding to the measuring current of the insulation monitoring device and used to test the correct function of the differential current detection is generated in the current measuring device.

Advantageously, the evaluating electronics are configured to assess the differential measuring current curve in order to effect synchronous insulation fault signaling between the insulation monitoring device and the grounded socket for insulation fault location.

The insulation monitoring device and the signaling device for signaling the insulation state disposed in the grounded socket for insulation fault location according to the invention are typically installed at a distance from each other.

According to the state of the art, synchronization of the insulation fault display would require communication via a data interface, such as PowerLine, RS485 or MODBUS. Disadvantageously, this is very expensive and would necessitate additional installation measures.

Synchronous insulation fault signaling, on the other hand, allows an insulation fault to be displayed simultaneously in the grounded socket according to the invention and in the insulation monitoring device.

The differential measuring current curve for synchronous insulation fault signaling is preferably assessed by detecting a change in amplitude of the differential measuring current.

Alternatively, the differential measuring current curve is assessed by detecting a change in pattern of the differential measuring current.

So by evaluating the curve over time of the measuring current detected by the measuring current transformer as a differential measuring current in the evaluating electronics by means of threshold observation or correlation calculation, for example, the grounded socket according to the invention receives information on whether an insulation fault is present from the insulation monitoring device.

Advantageously, the grounded socket according to the invention is realized as a permanently installed socket, as a mobile line coupler (multiple socket) or as an adapter plug (adapter).

As the grounded socket for insulation fault location according to the invention is installed directly at the place where the load to be put into operation is connected, i.e., where the plug is plugged in, medical personnel immediately recognizes by means of the signaling device whether an insulation fault is present on the load. The described increase in the measuring current of 10 µA to 50 µA, for example, after plugging in of the load supply line leads to immediate signaling of the insulation state at the socket in question.

The grounded socket can be realized as a permanently installed wall socket or as an adapter plug in the form of an attachable adapter. Furthermore, a realization as a line coupler in the form of a multiple socket having multiple grounded sockets according to the invention for equipping an equipment cart, for example, is intended.

The described grounded socket according to the invention for insulation fault location is based on the technical teaching described herein. In this respect, the technical effects mentioned above and the method-related advantages resulting therefrom also apply to the method features.

BRIEF DESCRIPTION OF THE DRAWING FIGURES

Other advantageous configuration features are apparent from the following description and from the drawings, which illustrate preferred embodiments of the invention based on examples.

DETAILED DESCRIPTION

Figure 1:
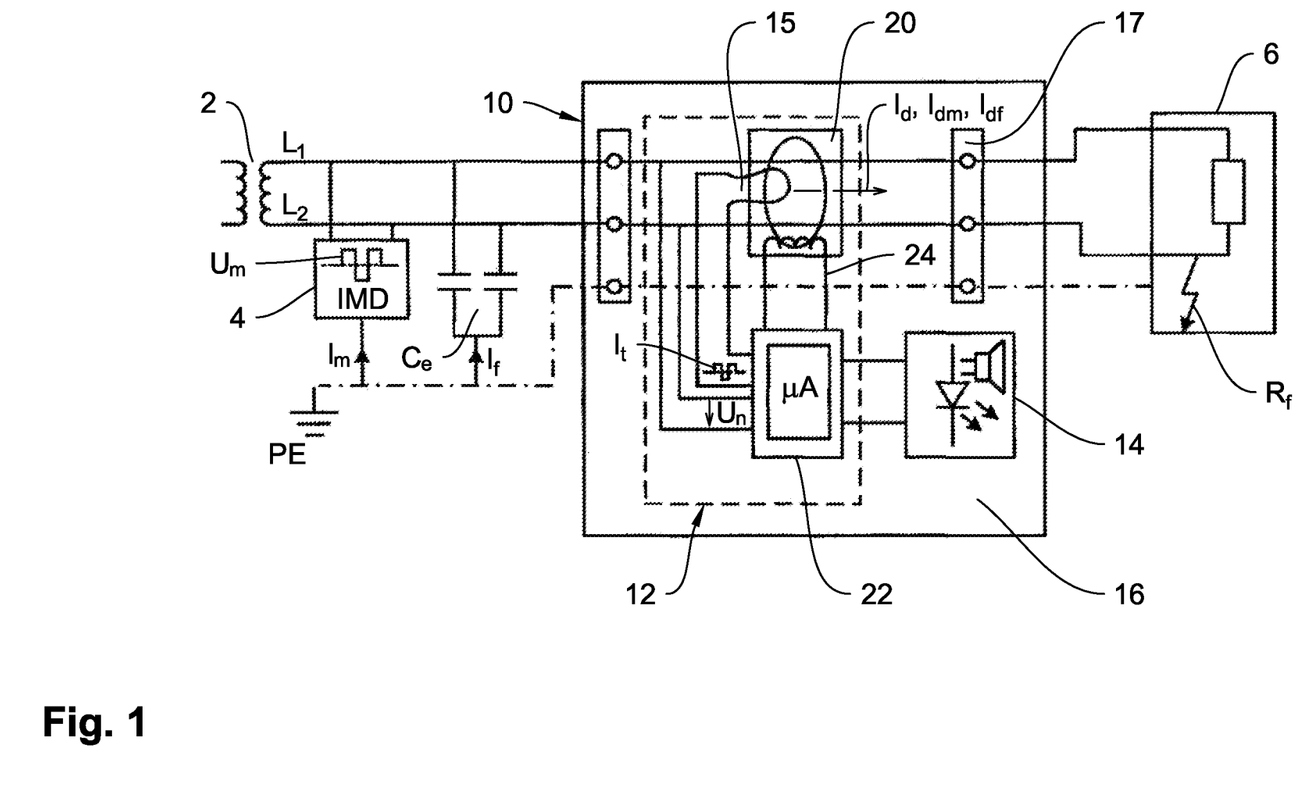
FIG. 1 shows a functional block diagram of a grounded socket according to the invention for insulation fault location.

FIG. 1 shows a grounded socket 10 according to the invention for insulation fault location in an ungrounded power supply system 2 (IT network) to which a load 6 is connected via active conductors $L_1$, $L_2$.

A standard insulation monitoring device 4 superimposing a measuring voltage $U_m$ on the IT network is connected between active conductors $L_1$, $L_2$ and ground PE for determining an insulation resistance $R_f$ (insulation fault). A measuring circuit with a measuring current $I_m$ driven by measuring voltage $U_m$ forms via active conductors $L_1$, $L_2$, insulation resistance $R_f$ and the protective conductor (protective conductor connection to ground PE) back to insulation monitoring device 4. Measuring current $I_m$ is measured in insulation monitoring device 4 and allows an assessment of the magnitude of insulation resistance $R_f$.

As essential components, grounded socket 10 according to the invention comprises a current measuring device 12, a signaling device 14 and a housing 16 having contacts 17. Contacts 17 are realized as plug contacts for connecting a plug of a supply line of load 6.

Current measuring device 12 has a measuring current transformer 20, a toroidal core of which surrounds active conductors $L_1$ and $L_2$ as a primary "winding", and evaluating electronics 22.

Measuring current transformer 20 detects measuring current $I_m$, which flows in the measuring circuit and continues as a differential measuring current $I_{dm}$ in active conductors $L_1$ and $L_2$, and transmits a differential current measurement result to evaluating electronics 22 via a secondary winding 24.

Evaluating electronics 22 are fed by a network voltage $U_n$ of ungrounded power supply system 2.

Furthermore, current measuring device 12 comprises a test loop 15, by means of which a test current $I_t$ is routed through measuring current transformer 20 to test the latter.

When an asymmetrical insulation fault $R_f$ occurs, measuring current transformer 20 additionally detects a fault current $I_r$ as a differential fault current $I_{df}$ which flows across always present leakage capacitances $C_c$ of ungrounded power supply system 2.

Following FIGS. 2 to 5 show different embodiments of grounded socket 10 according to the invention. The outer dimensions of the respective embodiments correspond to the dimensions of a standard, grounding-compatible conventional socket.

Figure 2:
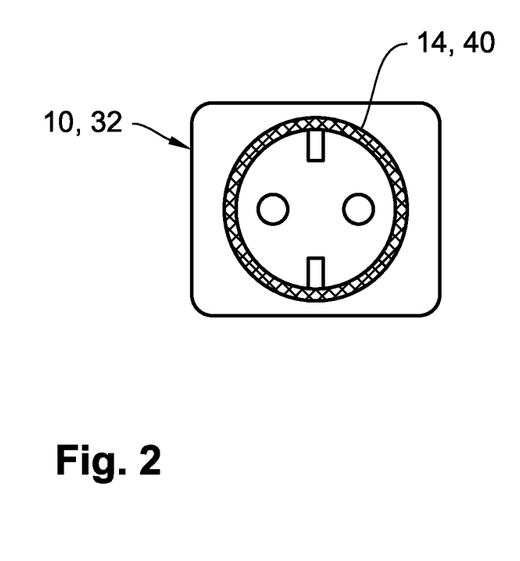
FIG. 2 shows a grounded socket according to the invention as a permanently installed socket.

In FIG. 2, grounded socket 10 according to the invention is realized as a permanently installed socket 32 in a wall outlet (wall socket) or for a cable duct installation, for example. At hand, signaling device 14 is realized as an optical display 40 in the form of a lit LED ring. For example, the LED ring can light up green when no insulation fault has been located, and changes to yellow once an insulation fault has been located.

Figure 3:
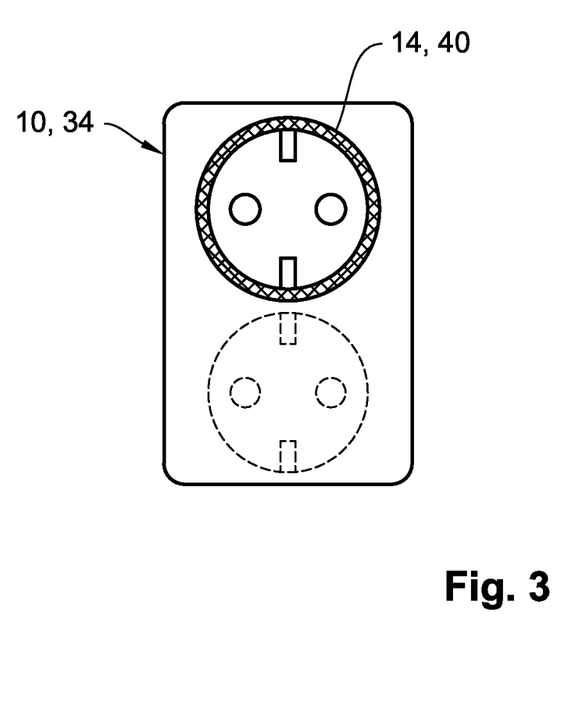
FIG. 3 shows a grounded socket according to the invention as an adapter plug.

FIG. 3 shows the configuration of grounded socket 10 according to the invention as an adapter plug 34 for a commercially available socket. This allows simple retrofitting of existing load connections with grounded socket 10 according to the invention for insulation fault location.

Figure 4:
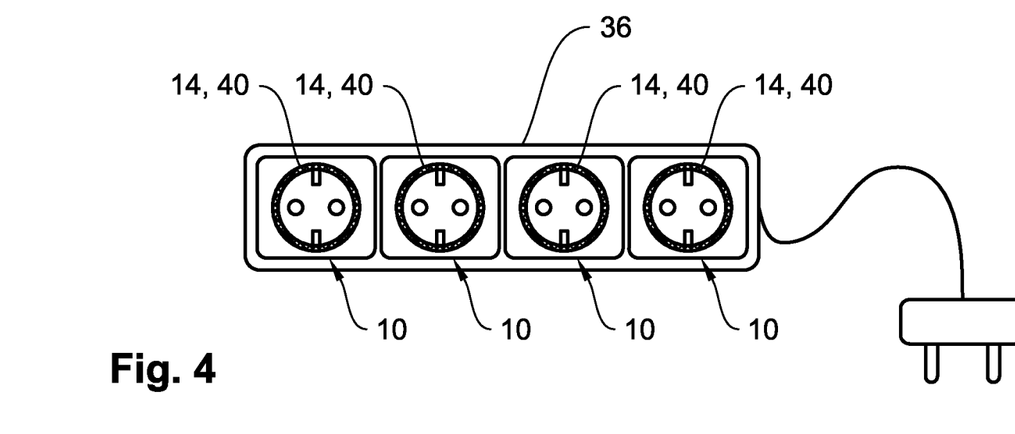
FIG. 4 shows a grounded socket according to the invention as a mobile line coupler.

In another embodiment according to FIG. 4, grounded socket 10 according to the invention is realized as a mobile line coupler 36 (multiple socket). This embodiment permits an insulation fault location individual to the load since insulation fault location is integrated for one or more of the slots of the multiple socket 36.

Figure 5:
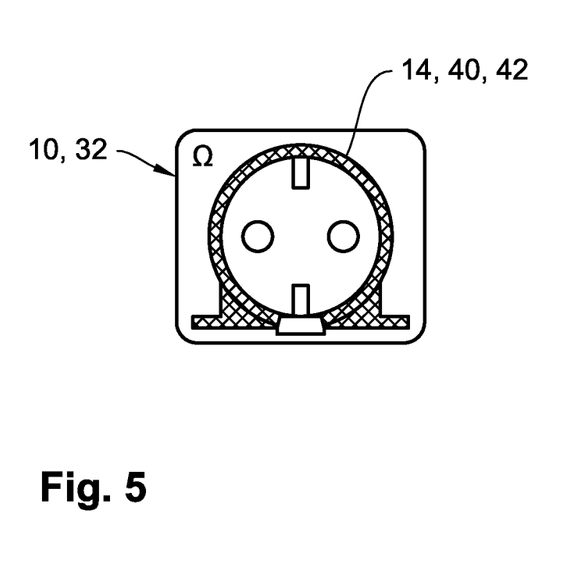
FIG. 5 shows a grounded socket according to the invention having an omega symbol as an optical display.

As an example of the grounded socket 10 according to the invention realized as a permanently installed socket 32, FIG. 5 shows a configuration of the signaling device 14 as an optical display 40 in the form of an omega symbol 42 for marking said socket as a grounded socket 10, 32 according to the invention including insulation fault location and therefor distinguishing it from conventional sockets without insulation fault location.

Figure 6:
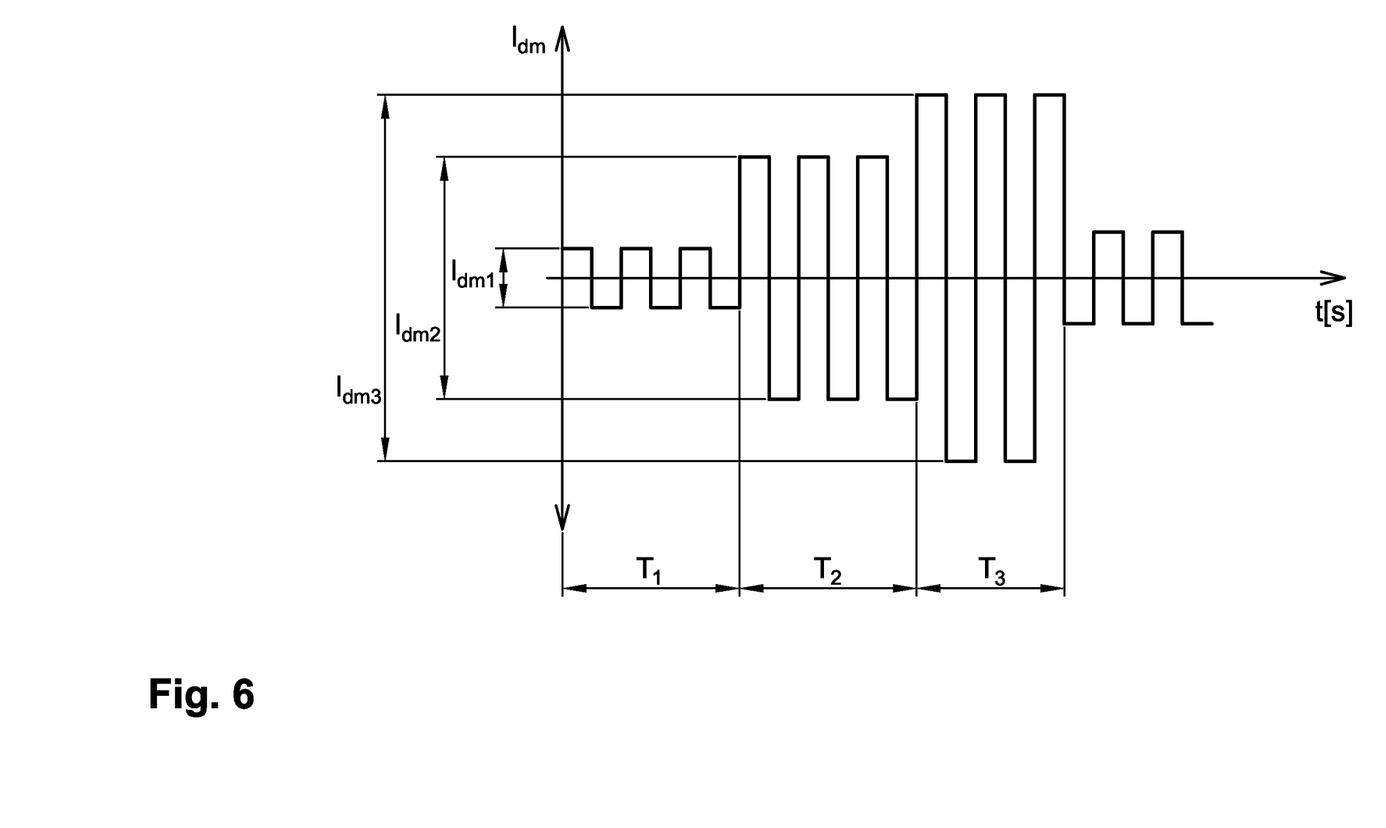
FIG. 6 shows a differential measuring current curve exhibiting a change in amplitude.
Figure 7:
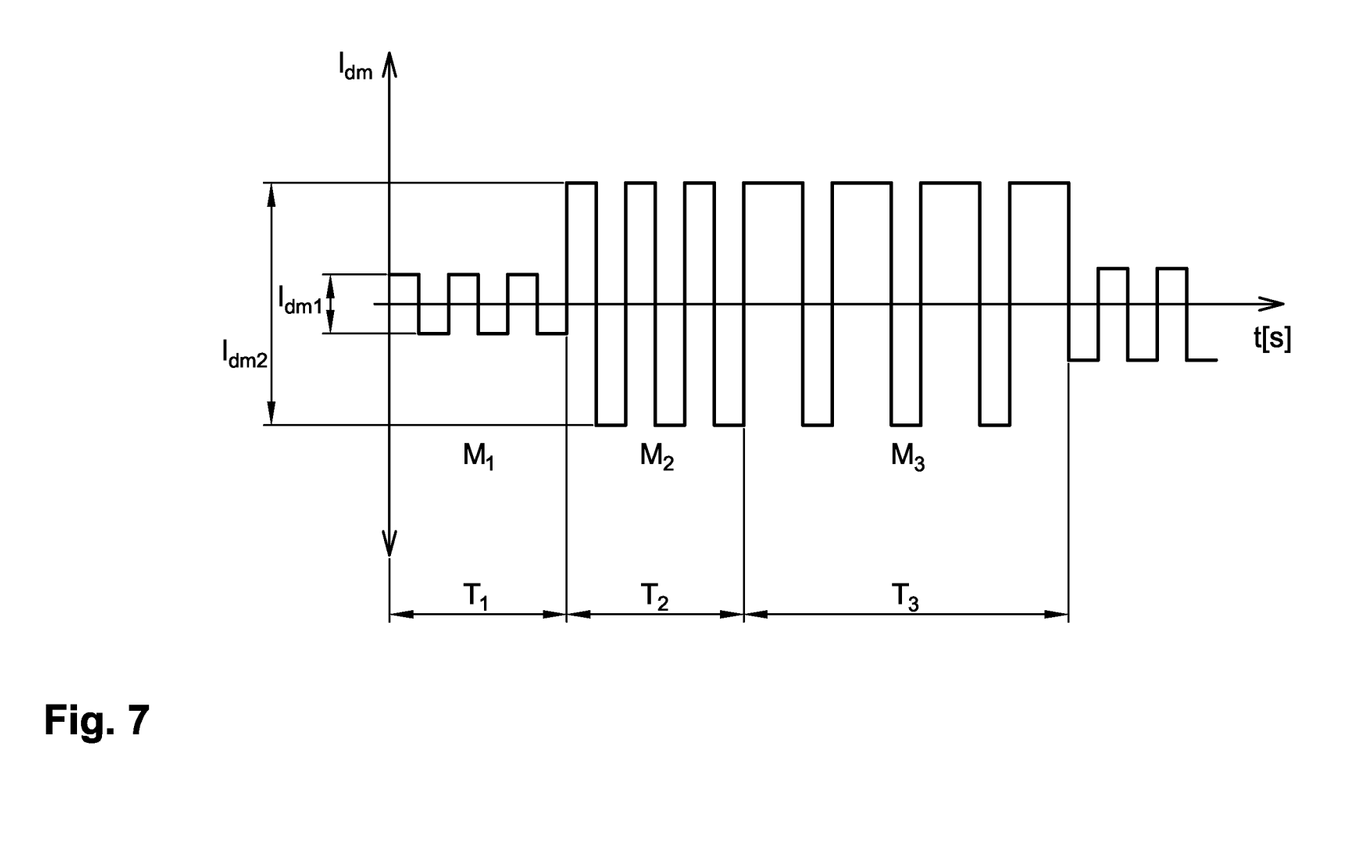
FIG. 7 shows a differential measuring current curve exhibiting a change in pattern.
Figure 8:
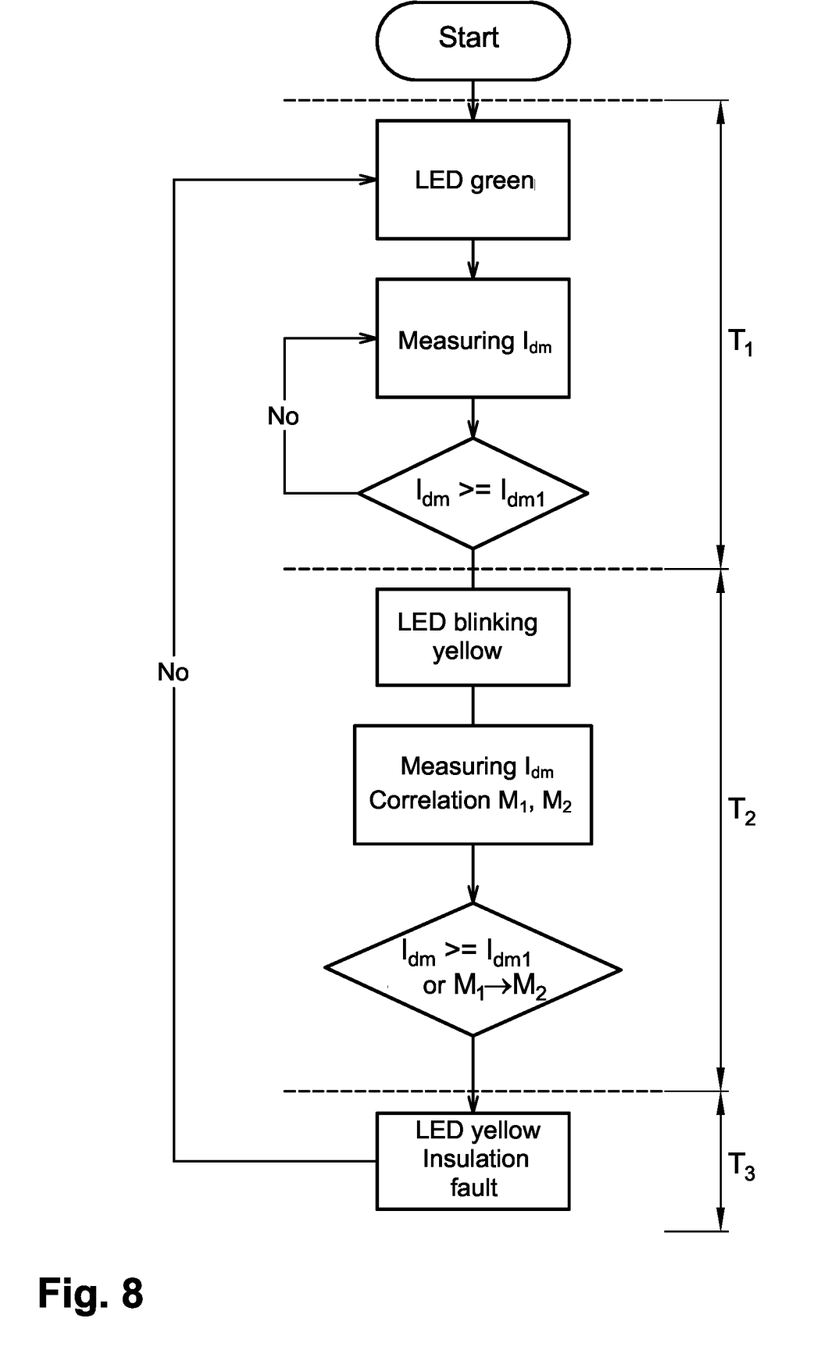
FIG. 8 shows a flow chart for synchronous insulation fault synchronization.

FIGS. 6 to 8 illustrate how the differential current measurement result is evaluated in evaluating electronics 22 by assessing differential measuring current curve $I_{dm}$ to synchronize insulation fault signaling between insulation monitoring device 4 and grounded socket 10 according to the invention.

Measuring current $I_m$ driven by measuring voltage $U_m$ continues at the location of measuring current transformer 20, i.e., in the socket, as differential measuring current $I_{dm}$ and is constantly measured there in a phase $T_1$. Evaluating electronics 22 test whether differential measuring current $I_{dm}$ exceeds a differential current threshold $I_{dm1}$ (peak-peak amplitude) applying to the fault-free case. If differential current threshold $I_{dm1}$ is not exceeded in said first phase $T_1$, optical display 40 lights up green (FIG. 8).

If detected differential measuring current $I_{dm}$ exceeds differential current threshold $I_{dm1}$, optical display 40 changes to a yellow-flashing display as a pre-warning (FIG. 8) in phase $T_2$.

Once insulation monitoring device 4 detects an insulation fault in ungrounded power supply system 2—based on its longer evaluation time—, insulation monitoring device 4, which is to be programmed accordingly, reduces its internal resistance by an admissible value and thereby increases measuring current $I_m$. As detected differential measuring current $I_{dm}$, measuring current $I_m$ thus exceeds a second differential current threshold $I_{dm2}$. This increase (amplitude modulation of the measuring currents) in phase $T_3$ is considered a criterion for an insulation fault report of insulation monitoring device 4, and yellow-flashing optical display 40 changes to a steady yellow display (FIG. 8).

Alternatively or additionally to the change in amplitude of measuring current $I_m$, a detected change in pattern of measuring current $I_m$ (coding of the measuring current) can also cause the transition from second phase $T_2$ to third phase $T_3$. Evaluating electronics 22 test whether the pattern of differential measuring current curve $I_{dm}$ has changed from a pattern $M_1$ to a pattern $M_2$ by correlation calculation. If a change in pattern is detected, optical display 40 changes to a steady yellow display in phase $T_3$ (FIG. 8).

The invention claimed is:

1. A grounded socket for locating an insulation fault in an ungrounded power supply system including insulation monitoring by a standard insulation monitoring device according to standard IEC61557-8 superimposing a measuring voltage on the ungrounded power supply system for determining an insulation resistance of the ungrounded power supply system, the grounded socket comprising:
a housing having electrical contacts;
a signaling device for signaling an insulation state; and
a current measuring device for detecting and evaluating a differential current, the current measuring device having a measuring current transformer and evaluating electronics,
wherein the current measuring device is configured for high-resolution detection in a μA range and evaluating the differential current by evaluating a measuring current driven by the measuring voltage as a differential measuring current, and wherein the evaluating electronics are configured to assess differential measuring current curve to establish synchronous insulating fault signaling between the standard insulation monitoring device and the grounded socket.

2. The grounded socket for locating the insulation fault according to claim 1, wherein the current measuring device is configured to detect and evaluate a fault current flowing at a network frequency of the ungrounded power supply system as a differential fault current.

3. The grounded socket for locating the insulation fault according to claim 1, wherein the current measuring device is AC/DC-sensitive.

4. The grounded socket for locating the insulation fault according to claim 1, wherein the current measuring device has a test loop routed through the measuring current transformer for generating a test current.

5. The grounded socket for locating the insulation fault according to claim 1, wherein the ground socket is realized as a permanently installed socket, as an adapter plug, or as a mobile line coupler.

6. A method for locating an insulation fault in an ungrounded power supply system including insulation monitoring by a standard insulation monitoring device according to standard IEC61557-8 superimposing a measuring voltage on the ungrounded power supply system for determining an insulation resistance of the ungrounded power supply system, the method comprising method steps to be executed in the grounded socket according to claim 1, including detecting and evaluating a differential current by means of a current measuring device having a measuring current transformer and evaluating electronics, the method comprising:
signaling an insulation state by means of a signaling device,
wherein evaluating the differential current includes detecting and evaluating a measuring current driven by the measuring voltage as a differential measuring current in high resolution in a μA range by means of the current measuring device; and
assessing a differential measuring current curve by means of the evaluating electronics to synchronize insulation fault signaling between the standard insulation monitoring device and the grounded socket.

7. The method for locating the insulation fault according to claim 6, wherein a fault current flowing at a network frequency of the ungrounded power supply system is detected and evaluated as a differential fault current by means of the current measuring device.

8. The method for locating the insulation fault according to claim 6, wherein the detection and evaluation by means of the current measuring device is AC/DC-sensitive.

9. The method for locating the insulation fault according claim 6, further including the step of generating a test current which is routed through the measuring current transformer of the current measuring device by means of a test loop.

10. The method for locating the insulation fault according to claim 6, wherein the differential measuring current curve is assessed by detecting a change in amplitude of the differential measuring current.

11. The method for locating the insulation fault according to claim 6, wherein the differential measuring current curve is assessed by detecting a change in pattern of the differential measuring current.

12. An ungrounded power supply system comprising a standard insulation monitoring device according to standard IEC61557-8 for insulation monitoring by superimposing a measuring voltage on the ungrounded power supply system for determining an insulation resistance of the ungrounded power supply system and a grounded socket for locating an insulation fault, the grounded socket comprising:
a housing having electrical contacts;
a signaling device for signaling an insulation state; and
a current measuring device for detecting and evaluating a differential current, the current measuring device having a measuring current transformer and evaluating electronics, wherein the current measuring device is configured for high-resolution detection in a μA range and evaluating the differential current includes evaluating a measuring current driven by the measuring voltage as a differential measuring current, and wherein the evaluating electronics are configured to assess a differential measuring current curve to establish synchronous insulation fault signaling between the standard insulating monitoring device and the grounded socket.

13. The ungrounded power supply system according to claim 12, wherein the current measuring device is configured to detect and evaluate a fault current flowing at a network frequency of the ungrounded power supply system as a differential fault current.

14. The ungrounded power supply system according to claim 12, wherein the current measuring device is AC/DC-sensitive.

15. The ungrounded power supply system according to claim 12, wherein the current measuring device has a test loop routed through the measuring current transformer for generating a test current.

16. The ungrounded power supply system according to claim 12, wherein the grounded socket is realized as a permanently installed socket, as an adapter plug or as a mobile line coupler.

\* \* \* \* \*